US 6,446,248 B1

(12) United States Patent
Solomon et al.

(10) Patent No.: US 6,446,248 B1
(45) Date of Patent: Sep. 3, 2002

(54) SPARE CELLS PLACEMENT METHODOLOGY

(75) Inventors: Richard L. Solomon; Paul J. Smith, both of Colorado Springs, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/493,467

(22) Filed: Jan. 28, 2000

(51) Int. Cl.[7] .................... G06F 17/50; H03K 19/00
(52) U.S. Cl. .................................. 716/17; 716/18
(58) Field of Search .................. 703/13–16; 716/213, 716/17, 18; 330/253, 255, 267, 274; 371/22.2

(56) References Cited

U.S. PATENT DOCUMENTS 5,361,041 A  * 11/1994  Lish ........................ 330/255
6,002,861 A  * 12/1999  Butts et al. ............ 395/500.37
6,226,775 B1 * 5/2001  Yamada ........................ 716/2

* cited by examiner

Primary Examiner—Matthew S. Smith
Assistant Examiner—Naum Levin

(57) ABSTRACT

Methods for designing an integrated circuit is disclosed. In the present invention, the integrated circuit is first created by placing and routing standard cells of the integrated circuit. After routing the standard cells, empty spaces unused by the standard cells are extracted. After extracting the unused areas, clusters of metal-programmable transistors are inserted into the unused areas by an area-based placement/routing tool to form "ponds" of gates (POGs).

When design changes are desired after the formation of the integrated circuit, the metal-programmable transistors are programmed to form desired spare cells to implement the desired design changes by making changes to the upper layer masks for the integrated circuit.

21 Claims, 5 Drawing Sheets

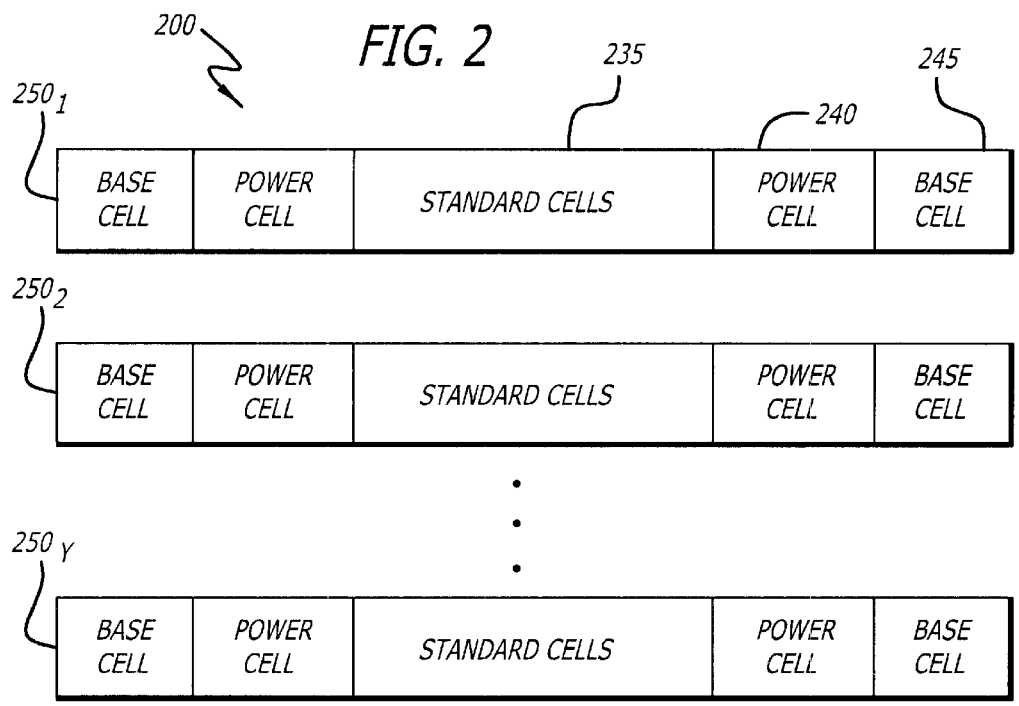
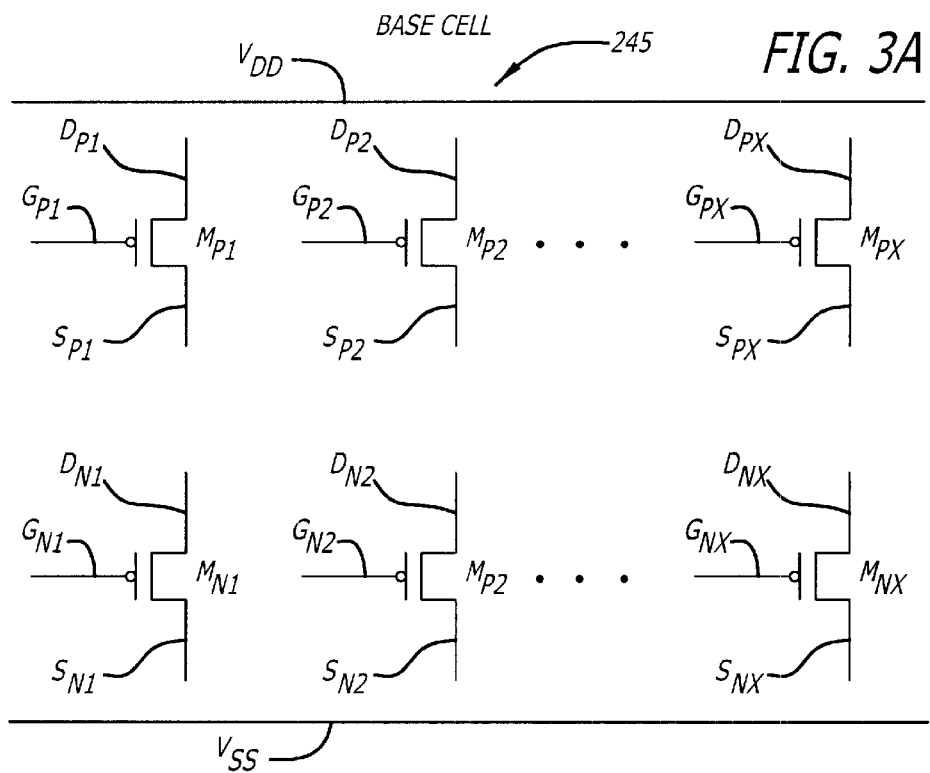

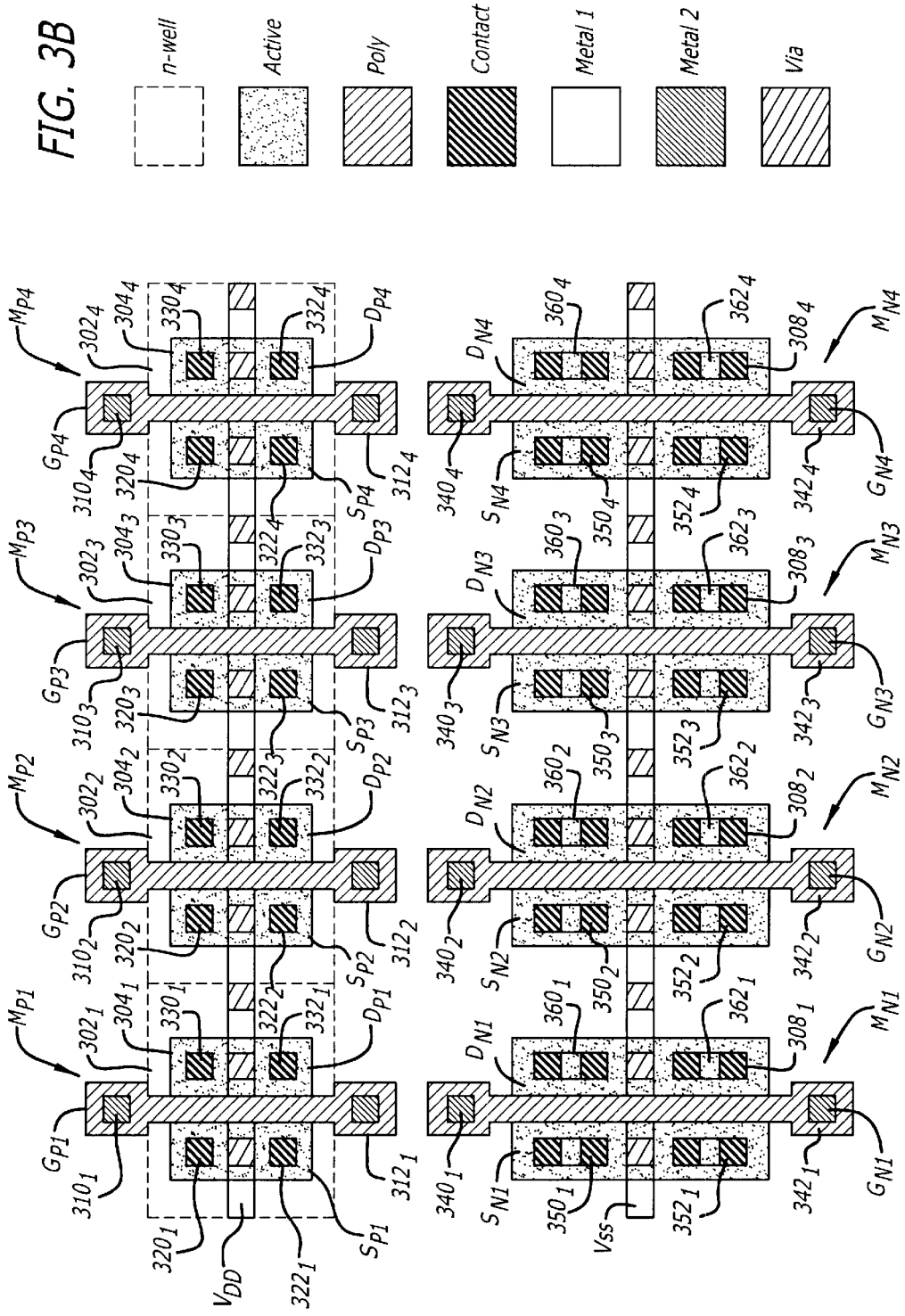

SPARE CELLS PLACEMENT METHODOLOGY

BACKGROUND OF THE INVENTION

1. Field of the Invention

The present invention generally relates to the art of microelectronic integrated circuits. In particular, the present invention relates to the art of designing integrated circuits.

2. Description of the Prior Art

An integrated circuit chip (hereafter referred to as an "IC" or a "chip") comprises cells and connections between the cells formed on a surface of a semiconductor substrate. The IC may include a large number of cells and require complex connections between the cells.

A cell is a group of one or more circuit elements such as transistors, capacitors, and other basic circuit elements grouped to perform a function. Each of the cells of an IC may have one or more pins, each of which, in turn, may be connected to one or more other pins of the IC by wires. The wires connecting the pins of the IC are also formed on the surface of the chip.

A net is a set of two or more pins which must be connected. Because a typical chip has thousands, tens of thousands, or hundreds of thousands of pins which must be connected in various combinations, the chip also includes definitions of thousands, tens of thousands, or hundreds of thousands of nets, or sets of pins. All the pins of a net must be connected. The number of the nets for a chip is typically in the same order as the order of the number of cells on that chip. Commonly, a majority of the nets include only two pins to be connected; however, many nets comprise three or more pins. Some nets may include hundreds of pins to be connected. A netlist is a list of nets for a chip.

Microelectronic integrated circuits consist of a large number of electronic components that are fabricated by layering several different materials on a silicon base or wafer. The design of an integrated circuit transforms a circuit description into a geometric description which is known as a layout. A layout consists of a set of planar geometric shapes in several layers.

The layout is then checked to ensure that it meets all of the design requirements. The result is a set of design files in a particular unambiguous representation known as an intermediate form that describes the layout. The design files are then converted into pattern generator files that are used to produce patterns called masks by an optical or electron beam pattern generator.

During fabrication, these masks are used to pattern a silicon wafer using a sequence of photolithographic steps. The component formation requires very exacting details about geometric patterns and separation between them. The process of converting the specifications of an electrical circuit into a layout is called the physical design.

Currently, the minimum geometric feature size of a component is on the order of 0.2 microns. However, it is expected that the feature size can be reduced to 0.1 micron within the next few years. This small feature size allows fabrication of as many as 4.5 million transistors or 1 million gates of logic on a 25 millimeter by 25 millimeter chip. This trend is expected to continue, with even smaller feature geometries and more circuit elements on an integrated circuit, and of course, larger die (or chip) sizes will allow far greater numbers of circuit elements.

Due to the large number of components and the exacting details required by the fabrication process, physical design is not practical without the aid of computers. As a result, most phases of physical design extensively use Computer Aided Design (CAD) tools, and many phases have already been partially or fully automated. Automation of the physical design process has increased the level of integration, reduced turn around time and enhanced chip performance.

The objective of physical design is to determine an optimal arrangement of devices in a plane or in a three dimensional space, and an efficient interconnection or routing scheme between the devices to obtain the desired functionality.

A. IC Configuration

An exemplary integrated circuit chip is illustrated in FIG. 1 and generally designated by the reference numeral 26. The circuit 26 includes a semiconductor substrate 26A on which are formed a number of functional circuit blocks that can have different sizes and shapes. Some are relatively large, such as a central processing unit (CPU) 27, a read-only memory (ROM) 28, a clock/timing unit 29, one or more random access memories (RAM) 30 and an input/output (I/O) interface unit 31. These blocks, commonly known as macroblocks, can be considered as modules for use in various circuit designs, and are represented as standard designs in circuit libraries.

The integrated circuit 26 further comprises a large number, which can be tens of thousands, hundreds of thousands or even millions or more of small cells 32. Each cell 32 represents a single logic element, such as a gate, or several logic elements interconnected in a standardized manner to perform a specific function. Cells that consist of two or more interconnected gates or logic elements are also available as standard modules in circuit libraries.

The cells 32 and the other elements of the circuit 26 described above are interconnected or routed in accordance with the logical design of the circuit to provide the desired functionality. Although not visible in the drawing, the various elements of the circuit 26 are interconnected by electrically conductive lines or traces that are routed, for example, through vertical channels 33 and horizontal channels 34 that run between the cells 32.

B. Layout Design Process

The input to the physical design problem is a circuit diagram, and the output is the layout of the circuit. This is accomplished in several stages including partitioning, floor planning, placement, routing and compaction.

1. Partitioning

A chip may contain several million transistors. Layout of the entire circuit cannot be handled due to the limitation of memory space as well as the computation power available. Therefore, the layout is normally partitioned by grouping the components into blocks such as subcircuits and modules. The actual partitioning process considers many factors such as the size of the blocks, number of blocks and number of interconnections between the blocks.

The output of partitioning is a set of blocks, along with the interconnections required between blocks. The set of interconnections required is the netlist. In large circuits, the partitioning process is often hierarchical, although non-hierarchical (e.g. flat) processes can be used, and at the topmost level a circuit can have between 5 to 25 blocks. However, greater numbers of blocks are possible and contemplated. Each block is then partitioned recursively into smaller blocks.

2. Floor planning and placement

This step is concerned with selecting good layout alternatives for each block of the entire chip, as well as between blocks and to the edges. Floor planning is a critical step as it sets up the ground work for a good layout. During placement, the blocks are exactly positioned on the chip. The goal of placement is to find a minimum area arrangement for the blocks that allows completion of interconnections between the blocks. Placement is typically done in two phases. In the first phase, an initial placement is created. In the second phase, the initial placement is evaluated and iterative improvements are made until the layout has minimum area and conforms to design specifications.

3. Routing

The objective of the routing phase is to complete the interconnections between blocks according to the specified netlist. First, the space not occupied by blocks, which is called the routing space, is partitioned into rectangular regions called channels. The goal of a router is to complete all circuit connections using the shortest possible wire length and using only the channel.

Routing is usually done in two phases referred to as the global routing and detailed routing phases. In global routing, connections are completed between the proper blocks of the circuit disregarding the exact geometric details of each wire and terminal. For each wire, a global router finds a list of channels that are to be used as a passageway for that wire. In other words, global routing specifies the loose route of a wire through different regions of the routing space.

Global routing is followed by detailed routing which completes point-to-point connections between terminals on the blocks. Loose routing is converted into exact routing by specifying the geometric information such as width of wires and their layer assignments. Detailed routing includes the exact channel routing of wires.

However, because of the complexity of today's VLSI circuits, initial silicon and early revisions normally have functional and/or timing problems that require correction before the circuit can go into production. ASIC (application specific integrated circuits) layouts are typically started before the complete simulation of the design is completed. Thus, design problems may be found after silicon masks and devices have been manufactured. This is especially true in standard cell designs where the functionality of the ASIC is implemented with pre-designed cells called standard cells that each implement a logic function. To reduce the cost of fixing later discovered problems, extra standard cells called revision cells or spare cells are inserted into the design to allow logic to be changed by connecting the revision cells to the standard cells of the ASIC. These cells would be a collection of logic gates, buffers and memory elements, which would be included into the netlist and layout for the purpose of allowing future fixes via metal only changes. The benefit of this approach is that the lower mask layers do not have to be recreated and thus saves the cost of recreating new masks. In addition, this approach saves time because the approach allows wafers to be processed up to the beginning point of metal processing until the new upper level masks are recreated.

One problem with the above revision approach is that it relies on the designer to incorporate the correct mix of revision cells into the original ASIC layout. If a function is needed that is not in the original ASIC layout, then this function must be synthesized from the available revision cells. However, if the designer failed to provide the original ASIC layout with revision cells suitable for implementing the needed function, then the ASIC layout and masks may have to scrapped and new masks implementing a new ASIC layout may need to be designed. Another problem with this approach is that the designer has little or no control over the placement of the spare cells within the layout.

To address the problems listed above with the revision cell approach, a method using a small array of metal-programmable transistors created as a standard cell on the ends of cell rows has been proposed as described in U.S. patent application Ser. No. 09/019,263, entitled "Integrated Circuit and Method of Revising Integrated Circuit Function" by David M. Weber and filed on Feb. 5, 1998, incorporated herein by reference (hereinafter '263 application).

However, the above approach is limited to placing the metal-programmable transistors on predetermined places. Therefore, a new method that provides a flexible set of revision cells which are not limited to cells chosen at layout time and not constrained to typical cell dimension is needed.

SUMMARY OF THE INVENTION

It is an object of the present invention to provide methods for designing an integrated circuit, which obviate for practical purposes the above mentioned limitations.

According to an embodiment of the present invention, an integrated circuit is first created by placing and routing standard cells of the integrated circuit. After routing the standard cells, empty spaces unused by the standard cells are extracted. After extracting the unused areas, clusters of metal-programmable transistors are inserted into the unused areas by an area-based placement/routing tool to form "ponds" of gates (POGs).

When design changes are desired after the formation of the integrated circuit, the metal-programmable transistors are programmed to form desired spare cells to implement the desired design changes by making changes to the upper layer masks for the integrated circuit.

The cost to implement the POGs are very minimal since the POGs are placed into the integrated circuit after placing and routing the standard cells.

BRIEF DESCRIPTION OF THE DRAWINGS

FIG. 2 illustrates a simplified block diagram of an integrated circuit that incorporates metal-programmable transistors.

FIG. 3A shows circuit diagram of the base cell used by the integrated circuit of FIG. 2.

FIG. 3B shows a layout diagram of the base cell used by the integrated circuit of FIG. 2.

DESCRIPTION OF THE PREFERRED EMBODIMENTS

Figure 1:
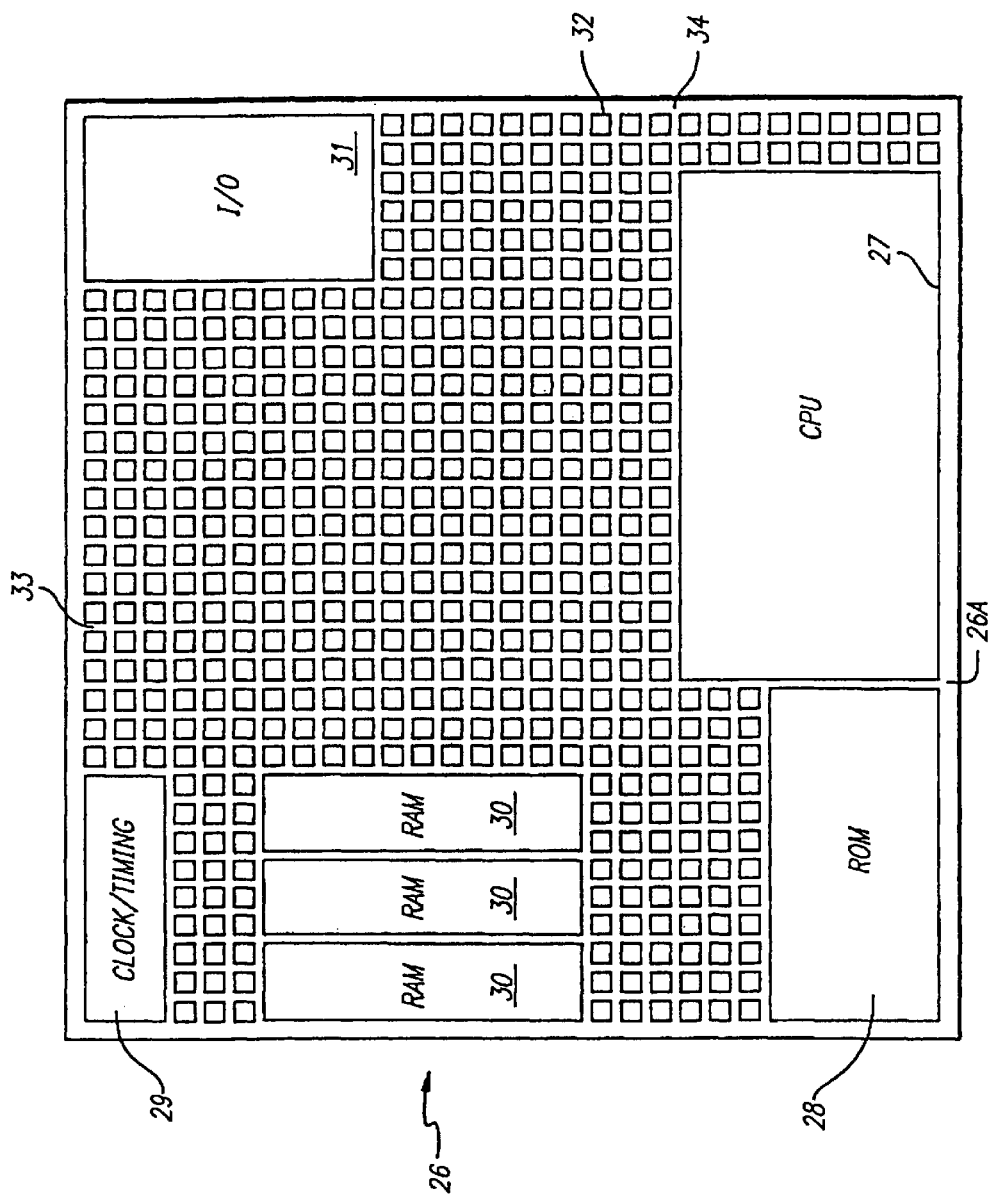
FIG. 1 is a simplified illustration of an integrated circuit chip on semiconductor material.

FIG. 2 shows a simplified block diagram of an integrated circuit 200 that incorporates the metal-programmable transistors. The integrated circuit 200 includes standard cells 235, power cells 240, and base cells 245 comprising the metal-programmable transistors, as described in the '263 application.

Each standard cell 235 is a group of transistors designed and configured to perform a predetermined function. A standard cell 235 may be logic gates, buffers or memory elements. Moreover, the physical layout of each standard cell 235 is optimized to consume a minimal amount of area. To this end, each standard cell 235 only includes a minimal number of tightly configured transistors to implement its specific function. The power cells 240 include voltage supply traces and ground traces. The traces of power cells 240 generally distribute power to their respective rows $250_1$, $250_2 \ldots 250_Y$. Furthermore, the power cells 240 are generally interconnected to one another in columns in order to distribute power between the rows $250_1, 250_2 \ldots 250_Y$.

Each base cell 245 includes transistors that have unconnected terminals which unlike the predetermined nature of the revision cells enable each base cell 245 to be programmed to implement more than one function. In other words, a single base cell 245 may be programmed to implement various functions such as an inverter, a two input NAND gate, or a D flip-flop.

A schematic drawing of a preferred embodiment of the base cells 245 is depicted in FIG. 3A. As shown in FIG. 3A, each base cell 245 includes a high voltage rail $V_{DD}$, a low voltage rail $V_{SS}$, several P-type transistors such as P-channel Metal Oxide Semiconductor Field Effect Transistors (MOSFET) $M_{P1}, M_{P2} \ldots M_{PX}$, and several N-type transistors such as N-channel MOSFETs $M_{N1}, M_{N2} \ldots M_{NX}$. Each P-type MOSFET $M_{P1}, M_{P2} \ldots M_{PX}$ includes a source $S_{P1}$, $S_{P2} \ldots S_{PX}$, a gate $G_{P1}, G_{P2} \ldots G_{PX}$, and a drain $D_{P1}, D_{P2} \ldots D_{PX}$ which are initially not operatively coupled to standard cells 235, power $V_{DD}$, ground $V_{SS}$, N-type MOSFETs $M_{N1}, M_{N2} \ldots M_{NX}$, or another P-type MOSFET $M_{P1}$, $M_{P2} \ldots M_{PX}$. Likewise, each N-type MOSFET $M_{N1}, M_{N2} \ldots M_{NX}$ includes a source $S_{N1}, S_{N2} \ldots S_{NX}$, a gate $G_{N1}, G_{N2} \ldots G_{NX}$, and a drain $D_{N1}, D_{N2} \ldots D_{NX}$ which are initially not operatively coupled to a standard cell 235, power $V_{DD}$, ground $V_{SS}$, a P-type MOSFET $M_{P1}, M_{P2} \ldots M_{PX}$, or another N-type MOSFET $M_{N1}, M_{N2} \ldots M_{NX}$.

In an embodiment of the present invention, each base cell 245 includes complementary pairs of P-type and N-type MOSFETs $M_{P1}, M_{P2} \ldots M_{PX}$, and $M_{N1}, M_{N2} \ldots M_{NX}$. These complementary pairs of MOSFETs enable easy implementation of CMOS (complementary metal oxide semiconductor) logic. The advantage of CMOS logic is that is consumes very little power compared to other types of logic.

A physical layout of the preferred base cell 245 is shown in FIG. 3B. Each base cell 245 is depicted in FIG. 3B as having a high voltage rail $V_{DD}$, a low voltage rail $V_{SS}$, a row of four P-type MOSFETs $M_{P1} \ldots M_{P4}$, and a row of four N-type MOSFETs $M_{N1} \ldots M_{N4}$. Each base cell 245 is fabricated with several physical layers upon a P-type silicon substrate. In particular, each P-type MOSFET $M_{P1} \ldots M_{P4}$ includes a n-well layer, an active layer, a poly layer, and a metal one layer that are separated by insulating layers. The n-well layer forms several n-wells $302_1 \ldots 302_4$ by doping the P-type substrate with negative dopants, and the active layer forms several active areas $304_1 \ldots 304_4$ over the n-wells $302_1 \ldots 302_4$ by removing a portion of a thick oxide layer (not-shown) in order to leave a thin oxide layer over the n-wells $302_1 \ldots 302_4$. Each active area $304_1 \ldots 304_4$ over the n-wells $302_1 \ldots 302_4$ essentially defines an area for a P-type MOSFET $M_{P1} \ldots M_{P4}$. The poly layer includes traces of poly-silicon that are deposited over the active areas $304_1 \ldots 304_4$ in order to form the gates $G_{P1} \ldots G_{P4}$ of the P-type MOSFETs $M_{P1} \ldots M_{P4}$.

The metal 1 layer includes metal traces that are deposited over the previous layers. In particular, the metal 1 layer includes metal traces $310_1 \ldots 310_4$ and $312_1 \ldots 312_4$ which are electrically coupled to the underlying poly-silicon with contacts in order to form terminals for the gates $G_{P1} \ldots G_{P4}$ of the P-type MOSFETs $M_{P1} \ldots M_{P4}$. Furthermore, the metal 1 layer includes metal traces $320_1 \ldots 320_4$ and $322_1 \ldots 322_4$ which are electrically coupled to the underlying n-wells $302_1 \ldots 302_4$ with contacts in order to form terminals for the sources $S_{P1} \ldots S_{P4}$ of the P-type MOSFETs $M_{P1} \ldots M_{P4}$. The metal 1 layer also includes metal traces $330_1 \ldots 330_4$ and $332_1 \ldots 332_4$ which are electrically coupled to the underlying n-wells $302_1 \ldots 302_4$ with contacts in order to form terminals for the drains $D_{P1} \ldots D_{P4}$ of the P-type MOSFETs $M_{P1} \ldots M_{P4}$. Furthermore, the metal 1 layer includes the high voltage rail $V_{DD}$ that distributes a high voltage (e.g. 2.8 volts) supplied by the power cells 240 to the base cells 245.

Similarly, each N-type MOSFET $M_{N1} \ldots M_{N4}$ includes an active layer, a poly layer, and a metal 1 layer that are separated by insulating layers. The active layer forms several active areas $308_1 \ldots 308_4$ in the P-type substrate by removing a portion of a thick oxide layer (not shown) in order to leave a thin oxide layer over the P-type substrate. Each active area over the P-type substrate essentially defines an area for a N-type MOSFET $M_{N1} \ldots M_{N4}$. The poly layer includes traces of poly-silicon that are deposited over the active areas $308_1 \ldots 308_4$ in order to form the gates $G_{N1} \ldots G_{N4}$ of the N-type MOSFETs $M_{N1} \ldots M_{N4}$.

The metal 1 layer includes metal traces that are deposited over the previous layers. In particular, the metal 1 layer includes metal traces $340_1 \ldots 340_4$ and $342_1 \ldots 342_4$ which are electrically coupled to the underlying poly-silicon with contacts in order to form terminals for the gates $G_{N1} \ldots G_{N4}$ of the N-type MOSFETs $M_{N1} \ldots M_{N4}$. Furthermore, the metal 1 layer includes metal traces $350_1 \ldots 350_4$ and $352_1 \ldots 352_4$ which are electrically coupled to the P-type substrate with contacts in order to form terminals for the sources $S_{N1} \ldots S_{N4}$ of the N-type MOSFETs $M_{N1} \ldots M_{N4}$. The metal 1 layer also includes metal traces $360_1 \ldots 360_4$ and $362_1 \ldots 362_4$ which are electrically coupled to the P-type substrate with contacts in order to form terminals for the drains $D_{N1} \ldots D_{N4}$ of the N-type MOSFETs $M_{N1} \ldots M_{N4}$. Furthermore, the metal 1 layer includes the low voltage rail $V_{SS}$ that distributes a low voltage (e.g. 0 volts) supplied by the power cells 240 to the base cells 245.

During the final stages of fabrication, the function of the integrated circuit 200 may be revised by (i) programming the various base cells 245 to implement various functions, and (ii) interconnecting the programmed base cells 245 to the standard cells 235. In particular, a metal 2 layer of conductor traces along with additional traces in the metal 1 layer may be added to the base cells 245 in order to program the base cells 245 and interconnect the base cells 245 with the standard cells 235. In general, these additional traces couple the terminals of the MOSFETs $M_{P1} \ldots M_{P4}$, and $M_{N1} \ldots M_{N4}$ in order to implement functional units. These functional units may then coupled to the standard cells 235 in order to revise, update, correct, or otherwise modify the function of the integrated circuit 200.

Due to the programmability of the base cells 245, the base cells 245 may be added to the integrated circuit 200 without great concern for future logic function needs. This is true because each base cell 245 can be programmed to perform any one of a plurality of functions such as an inverter, an AND gate, an OR gate, a NAND gate, a NOR gate, a XOR gate, a XNOR gate, or a D flip-flop. It should be noted that a single base cell 245 may be programmed to perform more than one function (e.g. a single base cell 245 may be programmed to simultaneously implement a two input NAND gate and an inverter). Furthermore, it should be noted that multiple base cells 245 may be interconnected in order to perform larger functions (e.g. several base cells 245 may be interconnected in order to implement a 4 bit counter). As a result of programmability, the base cells 245 may be added to the integrated circuit 200 without concern for future function needs unlike the revision cells. Accordingly, revisions to the integrated circuit 200 may be made to the extent base cells 245 are available.

In preferred embodiments of the present invention, base cells 245 are inserted into the circuit design layout wherever there is an unused area in the circuit, instead of just placing the base cells 245 at the ends of cell rows or at predesignated places on the circuit. In an embodiment of the present invention, an area-based placement/routing tool is used to insert the base cells 245 at unused areas in the circuit to create "ponds" of gates (POG) in many different parts of the circuit by using the base cells 245. The placement of the POGs are not limited to designated areas in the circuit.

Figure 4A:
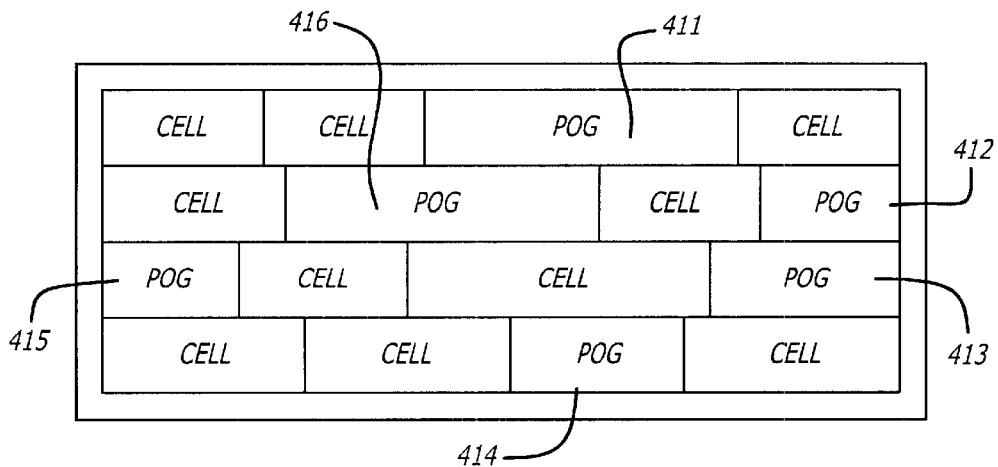
FIG. 4A illustrates the circuit of FIG. 4 filled with metal-programmable transistors.
Figure 4:
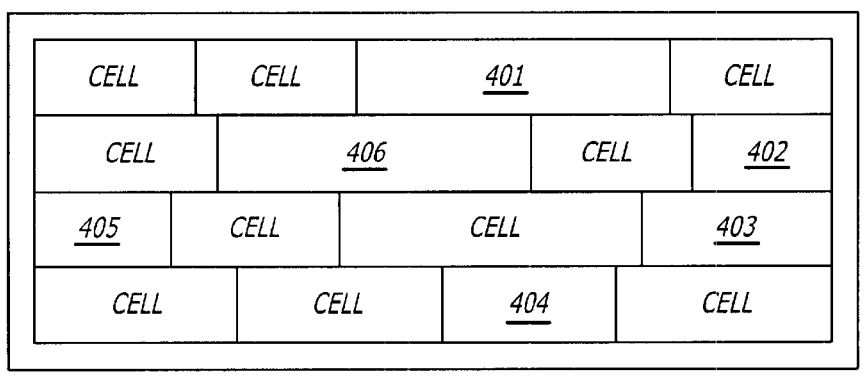
FIG. 4 illustrates a circuit with unused areas.

FIG. 4 illustrates a circuit with unused areas 401, 402, 403, 404, 405 and 406 existing next to areas occupied by standard cells. In embodiments of the present invention, the area-based placement/routing tool extracts the unused areas 401–406 and then inserts POGs 411, 412, 413, 414, 415 and 416 into unused areas 401–406, respectively, as shown in FIG. 4A. In preferred embodiments of the present invention, the POGs 411–416 are inserted into empty areas after the final standard cell area placement and routing is completed. In other words, the area-based placement/routing tool inserts the POGs 411–416 after the initial netlist is routed. Thus, the cost to implement the POGs are very minimal since the placement takes place after completing final standard cell placement and routing.

Each of the POGs 411–416 contains different numbers of the metal-programmable complementary pairs of MOS-FETs. The number of transistors contained in each of the POGs 411–416 depends on the size of each of the unused areas 401–406. However, it should be noted that each base cell 245 (i) could be implemented with only one type of transistor (e.g. N-type MOSFETs), (ii) could be implemented with other kinds of transistors (e.g. bipolar junction transistors, BJTs, and junction field effect transistors, JFETs), or (iii)-could be implemented with a mix of transistors (e.g. BJTs and MOSFETs). For example, the base cell 245 could be implemented with only N-type MOSFETs thus enabling easy implementation of NMOS logic which is faster than CMOS logic.

As a result, designers may make extensive design changes to the circuit after the release of initial design since the metal-programmable transistors may be programmed to implement different types of cells that may be needed for the design changes, as explained above. The design changes can be implemented by making changes only to the upper layer masks. In addition, the embodiments of the present invention are more likely to meet critical timing requirements if design changes are implemented because of the close proximity of the POGs to the standard cells that may need design changes. In embodiments of the present invention, the POGs are placed at any unused areas in the circuit instead of being placed just at the ends of cell rows or at predesignated places. Therefore, the POGs are located in close proximity to the standard cells.

Figure 5:
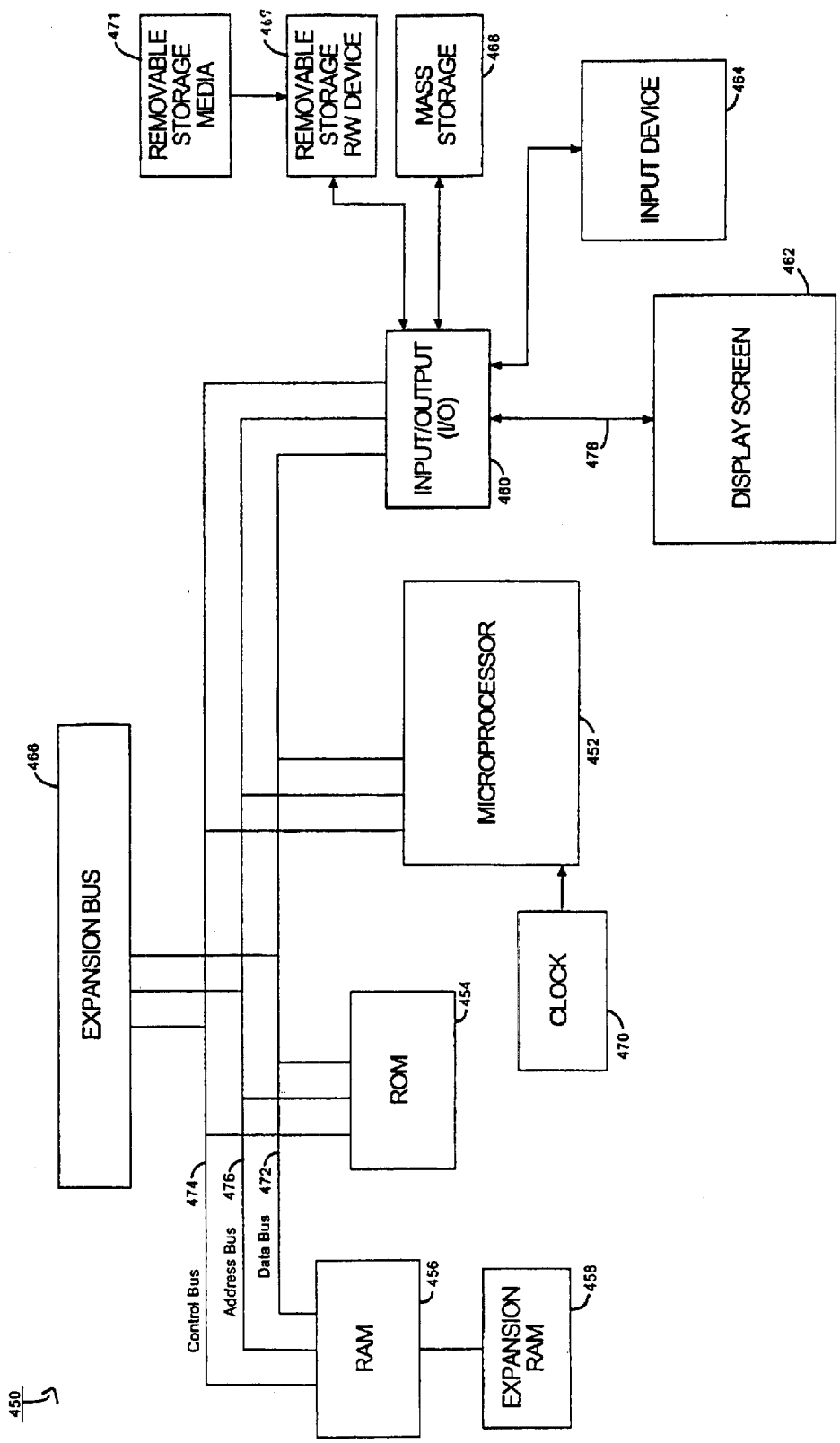
FIG. 5 is a block diagram of a general-purpose computer system, representing one suitable computer platform for implementing the methods of the invention.

Generally, the methods described herein with respect to IC design will be practiced with a general purpose computer, either with a single processor or multiple processors. The methods described herein will also be generally implemented in an ECAD system running on a general purpose computer. FIG. 5 is block diagram of a general purpose computer system, representing one of many suitable computer platforms for implementing the methods described above. FIG. 5 shows a general purpose computer system 450 in accordance with the present invention. As shown in FIG. 5, computer system 450 includes a central processing unit (CPU) 452, read-only memory (ROM) 454, random access memory (RAM) 456, expansion RAM 458, inpuvoutput (I/O) circuitry 460, display assembly 462, input device 464, and expansion bus 466. Computer system 450 may also optionally include a mass storage unit 468 such as a disk drive unit or nonvolatile memory such as flash memory and a real-time clock 470.

CPU 452 is coupled to ROM 454 by a data bus 472, control bus 474, and address bus 476. ROM 454 contains the basic operating system for the computer system 450. CPU 452 is also connected to RAM 456 by busses 472, 474, and 476. Expansion RAM 458 is optionally coupled to RAM 456 for use by CPU 452. CPU 452 is also coupled to the I/O circuitry 460 by data bus 472, control bus 474, and address bus 476 to permit data transfers with peripheral devices.

I/O circuitry 460 typically includes a number of latches, registers and direct memory access (DMA) controllers. The purpose of I/O circuitry 460 is to provide an interface between CPU 452 and such peripheral devices as display assembly 462, input device 464, and mass storage 468.

Display assembly 462 of computer system 450 is an output device coupled to I/O circuitry 460 by a data bus 478. Display assembly 462 receives data from I/O circuitry 460 via bus 478 and displays that data on a suitable screen.

The screen for display assembly 462 can be a device that uses a cathode-ray tube (CRT), liquid crystal display (LCD), or the like, of the types commercially available from a variety of manufacturers. Input device 464 can be a keyboard, a mouse, a stylus working in cooperation with a position-sensing display, or the like. The aforementioned input devices are available from a variety of vendors and are well known in the art.

Some type of mass storage 468 is generally considered desirable. However, mass storage 468 can be eliminated by providing a sufficient mount of RAM 456 and expansion RAM 458 to store user application programs and data. In that case, RAMs 456 and 458 can optionally be provided with a backup battery to prevent the loss of data even when computer system 450 is turned off. However, it is generally desirable to have some type of long term mass storage 468 such as a commercially available hard disk drive, nonvolatile memory such as flash memory, battery backed RAM, PC-data cards, or the like.

A removable storage read/write device 469 may be coupled to I/O circuitry 460 to read from and to write to a removable storage media 471. Removable storage media 471 may represent, for example, a magnetic disk, a magnetic tape, an opto-magnetic disk, an optical disk, or the like. Instructions for implementing the inventive method may be provided, in one embodiment, to a network via such a removable storage media.

In operation, information is input into the computer system 450 by typing on a keyboard, manipulating a mouse or trackball, or "writing" on a tablet or on position-sensing screen of display assembly 462. CPU 452 then processes the data under control of an operating system and an application program, such as a program to perform steps of the inventive method described above, stored in ROM 454 and/or RAM 456. CPU 452 then typically produces data which is output to the display assembly 462 to produce appropriate images on its screen.

Expansion bus 466 is coupled to data bus 472, control bus 474, and address bus 476. Expansion bus 466 provides extra ports to couple devices such as network interface circuits, modems, display switches, microphones, speakers, etc. to CPU 452. Network communication is accomplished through the network interface circuit and an appropriate network.

Suitable computers for use in implementing the present invention may be obtained from various vendors. Various computers, however, may be used depending upon the size and complexity of the OPC tasks. Suitable computers include mainframe computers, multiprocessor computers, workstations or personal computers. In addition, although a general purpose computer system has been described above, a special-purpose computer may also be used.

It should be understood that the present invention also relates to machine readable media on which are stored program instructions for performing the methods of this invention. Such media includes, by way of example, magnetic disks, magnetic tape, optically readable media such as CD ROMs, semiconductor memory such as PCMCIA cards, etc. In each case, the medium may take the form of a portable item such as a small disk, diskette, cassette, etc., or it may take the form of a relatively larger or immobile item such as a hard disk drive or RAM provided in a computer.

Although the present invention has been described in detail with regarding the exemplary embodiments and drawings thereof, it should be apparent to those skilled in the art that various adaptations and modifications of the present invention may be accomplished without departing from the spirit and scope of the invention. Accordingly, the invention is not limited to the precise embodiment shown in the drawings and described in detail hereinabove.

What is claimed is:

1. A method of designing an integrated circuit having standard cells, the method comprising the steps of:
   partitioning the integrated circuit;
   placing the standard cells on the integrated circuit;
   routing the standard cells in accordance with a netlist;
   extracting empty spaces on the integrated circuit; and
   placing base cells including programmable transistors in the extracted empty spaces.

2. The method of claim 1, further comprising the step of:
   determining a design change to be made to the integrated circuit.

3. The method of claim 2, further comprising the step of:
   implementing the design change by programming the programmable transistors by interconnecting the programmable transistors.

4. The method of claim 3, wherein the step of implementing the design change further includes the step of:
   interconnecting the programmed transistors to the standard cells to implement the design change.

5. The method of claim 4, wherein the step of implementing the design change further includes the step of:
   making changes to upper layer masks of the integrated circuit.

6. The method of claim 3, wherein programming the programmable transistors includes the step of adding traces to the integrated circuit to interconnect the programmable transistors.

7. The method of claim 3, wherein the programmable transistors include metal-programmable transistors having a plurality of complimentary transistor pairs.

8. The method of claim 7, wherein each complimentary transistor pair includes one-P type transistor and one N-type transistor.

9. The method claim 1, wherein the step of placing the base cells is conducted by an area-based placement and routing tool.

10. An apparatus for designing an integrated circuit having standard cells, said apparatus comprising:
    a processor for executing stored program instruction steps; and
    a memory connected to the processor for storing the program instruction steps,
    wherein the program instruction steps include:
    partitioning the integrated circuit;
    placing the standard cells on the integrated circuit;
    routing the standard cells in accordance with a netlist;
    extracting empty spaces on the integrated circuit; and
    placing base cells including programmable transistors in the extracted empty spaces.

11. The apparatus of claim 10, wherein the program instruction steps further include:
    determining a design change to be made to the integrated circuit.

12. The apparatus of claim 11, wherein the program instruction steps further include:
    implementing the design change by programming the programmable transistors by interconnecting the programmable transistors.

13. The apparatus of claim 12, wherein the step of implementing the design change further includes the step of:
    interconnecting the programmed transistors to the standard cells to implement the design change.

14. The apparatus of claim 13, wherein the step of implementing the design change further includes the step of:
    making changes to upper layer masks of the integrated circuit.

15. The apparatus of claim 12, wherein programming the programmable transistors includes the step of adding traces to the integrated circuit to interconnect the programmable transistors.

16. The apparatus of claim 12, wherein the programmable transistors include metal-programmable transistors having a plurality of complimentary transistor pairs.

17. An ECAD system for designing an integrated circuit having standard cells, said ECAD system comprising:
    means for partitioning the integrated circuit;
    means for placing the standard cells on the integrated circuit;
    means for routing the standard cells in accordance with a netlist;
    means for extracting empty spaces on the integrated circuit; and
    means for placing base cells including programmable transistors in the extracted empty spaces.

18. The ECAD system for claim 17 further comprising:
    means for determining a design change to be made to the integrated circuit.

19. The ECAD system for claim 18 further comprising:
    means for implementing the design change by programming the programmable transistors by interconnecting the programmable transistors.

20. The ECAD system for claim 19 further comprising:
    means for interconnecting the programmed transistors to the standard cells to implement the design change.

21. The ECAD system for claim 20, further comprising:
    means for making changes to upper layer masks of the integrated circuit.

* * * * *